United States Patent
Miyasaka et al.

(10) Patent No.: US 8,546,283 B2
(45) Date of Patent: Oct. 1, 2013

(54) SUBSTRATE FOR EUVL OPTICAL MEMBER

(75) Inventors: Junko Miyasaka, Tokyo (JP); Akio Koike, Tokyo (JP); Tomonori Ogawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/531,928

(22) Filed: Jun. 25, 2012

(65) Prior Publication Data
US 2012/0264584 A1 Oct. 18, 2012

Related U.S. Application Data

(63) Continuation of application No. PCT/JP2010/073884, filed on Dec. 24, 2010.

(30) Foreign Application Priority Data

Dec. 25, 2009 (JP) ................................ 2009-295221

(51) Int. Cl.
*C03C 3/06* (2006.01)
*C03C 3/076* (2006.01)
*C03C 3/112* (2006.01)

(52) U.S. Cl.
USPC .................. 501/54; 501/55; 501/57

(58) Field of Classification Search
USPC .................... 501/53, 54, 55, 56, 57
See application file for complete search history.

(56) References Cited

U.S. PATENT DOCUMENTS

| | | | |
|---|---|---|---|
| 7,294,595 B2 * | 11/2007 | Iwahashi et al. | 501/54 |
| 7,989,378 B2 | 8/2011 | Koike et al. | |
| 2006/0179879 A1 | 8/2006 | Ellison et al. | |
| 2007/0134566 A1 * | 6/2007 | Maida et al. | 430/5 |
| 2009/0143213 A1 * | 6/2009 | Hrdina et al. | 501/53 |

FOREIGN PATENT DOCUMENTS

| WO | WO 2009/084717 | 7/2009 |
|---|---|---|
| WO | WO 2009/107847 | 9/2009 |
| WO | WO 2009/107858 | 9/2009 |
| WO | WO 2009/107869 | 9/2009 |
| WO | WO 2009/107870 | 9/2009 |
| WO | WO 2009/116690 | 9/2009 |
| WO | WO 2009/145288 | 12/2009 |

OTHER PUBLICATIONS

International Search Report issued Jun. 27, 2011 in PCT/JP2010/073884 filed Dec. 24, 2010.
Written Opinion of the International Searching Authority on Jun. 27, 2011.

* cited by examiner

*Primary Examiner* — Kaj Olsen
*Assistant Examiner* — Noah Wiese
(74) *Attorney, Agent, or Firm* — Oblon, Spivak, McClelland, Maier & Neustadt, L.L.P.

(57) ABSTRACT

The present invention relates to a substrate for EUV lithography optical member, comprising a silica glass containing $TiO_2$, in which the substrate has two opposite surfaces, and the substrate has temperatures at which a coefficient of linear thermal expansion (CTE) is 0 ppb/° C. (Cross-Over Temperature: COT), and in which the two opposite surfaces have difference in the COTs of 5° C. or more.

18 Claims, 3 Drawing Sheets

SUBSTRATE FOR EUVL OPTICAL MEMBER

TECHNICAL FIELD

The present invention relates to a substrate for EUV lithography (hereinafter, it may be referred to as "EUVL" in this specification) optical member used as a substrate of EUVL optical member such as photomasks or mirrors which are used in an exposure tool for EUVL.

The EUV (Extreme UltraViolet) light as referred to in the invention means light having a wavelength in a soft X-ray region or a vacuum ultraviolet region, specifically light having a wavelength of from about 0.2 to 100 nm.

BACKGROUND ART

In the photolithography technology, an exposure tool for manufacturing an integrated circuit by transferring a fine circuit pattern onto a wafer has hitherto been widely utilized. With the trend toward a higher degree of integration and a higher function of an integrated circuit, the refinement of the integrated circuit is advancing. The exposure tool is hence required to form a circuit pattern image with high resolution on a wafer surface at a long focal depth, and shortening of the wavelength of an exposure light source is being advanced. The exposure light source is further advancing from conventional g-line (wavelength: 436 nm), i-line (wavelength: 365 nm) and a KrF excimer laser (wavelength: 248 nm), and an ArF excimer layer (wavelength: 193 nm) is employed. Also, in order to cope with a next-generation integrated circuit whose circuit line width will become 65 nm or less, an immersion lithography technique and a double exposure technique, each using an ArF excimer laser, are employed. However, it is considered that even these techniques would be able to cover only the generation with a line width of up to 22 nm.

Under the foregoing technical trends, a lithography technique using, as an exposure light source, light having a wavelength of 13 nm to represent EUV light is considered to be applicable over generation of 22 nm and thereafter, and is attracting attention. The principle of image formation of the EUV lithography is identical with that of the conventional lithography from the viewpoint that a mask pattern is transferred using a projection optical system. However, since there is no material capable of transmitting light therethrough in the EUV light energy region, a refractive optical system cannot be used. Accordingly, the optical systems are all reflecting optical systems.

The EUVL optical member used in an exposure tool for EUVL includes a photomask and a mirror. In the case of the photomask, the EUVL optical member is basically configured with (1) a substrate, (2) a reflective multilayer formed on the substrate and (3) an absorber layer formed on the reflective multilayer. In the case of the mirror, the EUVL optical member is basically configured with (1) a substrate and (2) a reflective multilayer formed on the substrate. For the reflective multilayer, forming an Mo/Si reflective multilayer in which an Mo layer and an Si layer are alternately laminated is investigated; and for the absorber layer, Ta and Cr are investigated as a film-forming raw material. For the substrate, a material having a low coefficient of linear thermal expansion (CTE) is required so as not to generate a strain even under irradiation with EUV light. For the material having a low CTE, a silica glass containing $TiO_2$ (hereinafter, it may be referred to as "$TiO_2$—$SiO_2$ glass" in the specification) is known as an extremely low thermal expansion material having a CTE lower than that of a quartz glass. Also, since the CTE can be controlled by the $TiO_2$ concentration in glass, a zero-expansion glass whose CTE is close to 0 can be obtained. Accordingly, the $TiO_2$—$SiO_2$ glass is investigated to be used as a substrate of an EUVL optical member.

In carrying out EUVL, the temperature in the exposure tool for EUVL is strictly controlled to be $22\pm3°$ C. for the purpose of preventing change in dimension of EUVL optical members such as a photomask and a mirror in the exposure tool caused by temperature changes thereof. In this state, the temperature of a mounting surface of the EUVL optical member in the exposure tool for EUVL reaches $22\pm3°$ C. However, it is suggested that, among the EUVL optical members, the temperature at the incidence surface side for EUV light is increased by the irradiation of high energy EUV light, and the temperature becomes higher than the temperature ($22\pm3°$ C.) at the mounting surface side.

For this reason, it is preferred that the substrate of EUVL optical member has a wide temperature region at which CTE is substantially zero. However, the conventional $TiO_2$—$SiO_2$ glass has a narrow temperature region at which the CTE is substantially zero, and the glass was not sufficient to use in the substrate of EUVL optical member. In the present specification, the term "the CTE is substantially zero" means that the CTE is $0\pm50$ ppb/° C., and preferably $0\pm25$ ppb/° C.

Patent Document 1 discloses that a low expansion glass member having an average CTE change at the use temperature is 1 ppb/° C./° C. or less is obtained by preparing a $TiO_2$—$SiO_2$ glass having temperature at which CTE is 0 ppb/° C. (Cross-Over Temperature: COT) of 30° C. or higher.

CITATION LIST

Patent Literature

Patent Document 1: US-A-2009-0143213

SUMMARY OF INVENTION

However, in the case that the low expansion glass member disclosed in Patent Document 1 is used as a substrate of EUVL optical member, COT in the whole glass member is uniform. Therefore, in the case that a glass member having uniform COT which corresponds to the temperature of the mounting surface side at the time of carrying out EUVL is used, the incidence surface side for EUV light irradiated with high energy EUV light has a temperature higher than the temperature of the mounting surface, and as a result, CTE is larger than zero. Furthermore, in the case that a glass member having uniform COT which corresponds to the temperature of the incidence surface side for EUV light at the time of EUV light irradiation is used, CTE is smaller than zero at the mounting surface side at which a temperature at the time of EUV light irradiation is lower than that of the incidence surface side for EUV light. In other words, CTE distribution occurs in the glass member by temperature difference between the incidence surface side for EUV light at the time of EUV light irradiation and the mounting surface side (that is to say, back surface side of the incidence surface). Depending on the degree of variation of the CTE distribution, a portion in which CTE is not substantially zero, that is, a portion in which CTE is fallen outside a range of $0\pm50$ ppb/° C., occurs in the glass member. When such a portion occurs in the glass substrate, distortion and deformation may occur in the glass substrate, leading to a problem.

Of EUVL optical members, particularly in the case of a mirror, a thickness of a substrate, that is, a distance between the incidence surface for EUV light and its back surface, is large as about from 3 to 20 cm. Therefore, temperature difference between the incidence surface side for EUV light and its back surface side is prone to be large at the time of irradiation with EUV light, leading to a problem. For example, in the case of a mirror in which a substrate has a thickness of 10 cm, temperature difference up to about 50° C. possibly occurs between the incidence surface side for EUV light and its back surface side at the time of irradiation with EUV light.

In order to solve the above problems of the conventional technologies, an object of the present invention is to provide a substrate for EUVL optical member, having suitable thermal expansion characteristics at the time of carrying out EUVL. More specifically, the object of the present invention is to provide a substrate for EUVL optical member, in which a coefficient of linear thermal expansion (CTE) in the whole optical member is substantially zero at the time of irradiation with EUV light.

In order to accomplish the above objects, the present invention provides a substrate for EUV lithography optical member, comprising a silica glass containing $TiO_2$, wherein the substrate has two opposite surfaces, and the substrate has temperatures at which a coefficient of linear thermal expansion (CTE) is 0 ppb/° C. (Cross-Over Temperature: COT), and wherein the two opposite surfaces have difference in the COTs of 5° C. or more.

In the substrate for EUV lithography optical member of the present invention, one surface of the two opposite surfaces preferably has the COT of 22° C.±3° C., and the other surface preferably has the COT of 5° C. or more higher than the COT of the one surface.

In the substrate for EUV lithography optical member of the present invention, the substrate preferably has COTs varying in a stepwise fashion from one surface toward the other surface.

Alternatively, in the substrate for EUV lithography optical member of the present invention, the substrate preferably has COTs varying continuously from one surface toward the other surface.

In the substrate for EUV lithography optical member of the present invention, the COTs is preferably controlled by the $TiO_2$ concentration in the silica glass.

In the substrate for EUV lithography optical member of the present invention, the COTs is preferably controlled by a fictive temperature of the silica glass.

In the substrate for EUV lithography optical member of the present invention, the $TiO_2$ concentration in the silica glass is preferably from 3% to 10% by mass.

In the substrate for EUV lithography optical member of the present invention, the silica glass preferably has an F concentration of 1,000 ppm or more.

In the substrate for EUV lithography optical member of the present invention, the silica glass preferably has an OH concentration of 600 ppm or more.

In the substrate for EUV lithography optical member of the present invention, the silica glass preferably has a fictive temperature of lower than 1,150° C.

The substrate for EUVL optical member of the present invention is that CTE in the whole substrate for the optical member is substantially zero at the time of irradiation with EUV light, and is therefore extremely suitable as a substrate of EUVL optical member such as a mask and a mirror.

DESCRIPTION OF EMBODIMENTS

The substrate for EUVL optical member of the present invention is described below by reference to the drawings.

Figure 1:
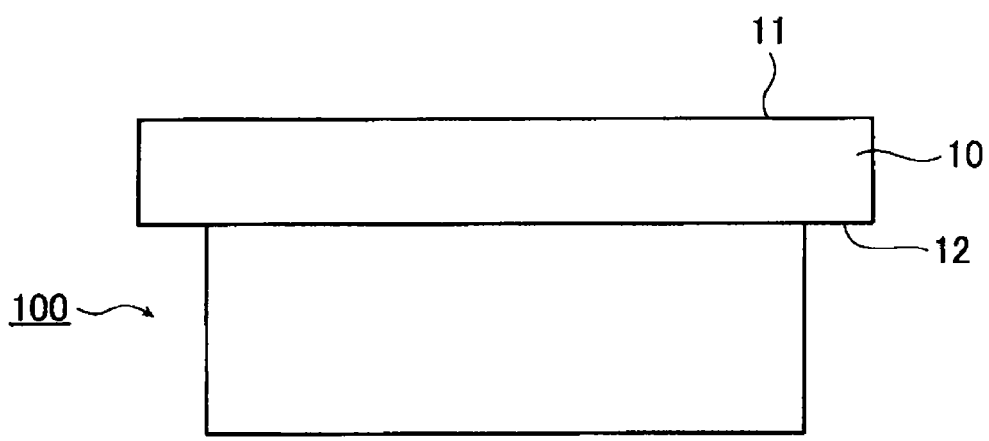
FIG. 1 is a side view showing one embodiment of the substrate for EUVL optical member of the present invention, in which the substrate for EUVL optical member is shown in a state of being mounted on an electrostatic chuck.

FIG. 1 is a side view showing one embodiment of the substrate for EUVL optical member of the present invention, in which the substrate for EUVL optical member is shown in a state of being mounted on an electrostatic chuck.

In carrying out EUVL, the EUVL optical member such as a mask substrate and a mirror is mounted on an electrostatic chuck provided in an exposure tool (not shown).

FIG. 1 shows the state that a substrate 10 for EUVL optical member used as a substrate of EUVL optical member is mounted on an electrostatic chuck 100 provided in an exposure tool (not shown).

In FIG. 1, a surface 11 is an optical surface of the substrate 10 for EUVL optical member. A multilayered reflective film is formed on the surface 11 (in the case that the EUVL optical member is a mirror; on the other hand, in the case that the EUVL optical member is a photomask, an absorber layer is further formed on the multilayered reflective film), and when carrying out EUVL, the surface 11 serves as an incidence surface for EUV light. In FIG. 1, a surface 12 is a back surface of the surface 11, and serves as a mounting surface of the electrostatic chuck 100 when carrying out EUVL.

In the present invention, the two opposite surfaces of the substrate for EUVL optical member mean two surfaces having the relationship of an incidence surface for EUV light and its back surface at the time of irradiation with EUV light as the surface 11 and the surface 12 in FIG. 1. In the present specification, the incidence surface for EUV light may be hereinafter simply referred to as an "incidence surface", and a back surface of the incidence surface may be hereinafter simply referred to as a "back surface".

As described above, temperature difference occurs between the incidence surface side and the back surface side at the time of irradiation with EUV light. In the substrate of EUVL optical member, when COT is uniform in the whole glass member like the low expansion glass member disclosed in Patent Document 1, CTE distribution occurs in the substrate by the temperature difference between the incidence surface side and the back surface side. Further, depending on the degree of variation of the CTE distribution, a portion in which CTE is not substantially zero, that is, a portion in which CTE is fallen outside 0±50 ppb/° C., occurs in the substrate.

In the present invention, owing to bringing difference to COTs of the two opposite surfaces of the substrate for EUVL optical member, CTE distribution in the substrate for the optical member, occurred by temperature difference between the incidence surface side and its back surface side at the time of EUV light irradiation is suppressed, thereby CTE in the whole substrate for optical member satisfies substantially zero. Specifically, CTE in the whole substrate for optical member satisfies 0±50 ppb/° C., and preferably, CTE in the whole substrate for optical member satisfies 0±25 ppb/° C.

The CTE that the whole substrate for optical member should satisfy at the time of irradiation with EUV light varies depending on the intended use of the substrate, that is, the EUVL optical member using the substrate. For example, in the case of a substrate of a lightening system mirror, CTE in the whole substrate for optical member is required to satisfy 0±50 ppb/° C. On the other hand, in the case of a substrate of a projection system mirror, CTE in the whole substrate for optical member is required to satisfy 0±25 ppb/° C.

Figure 2:
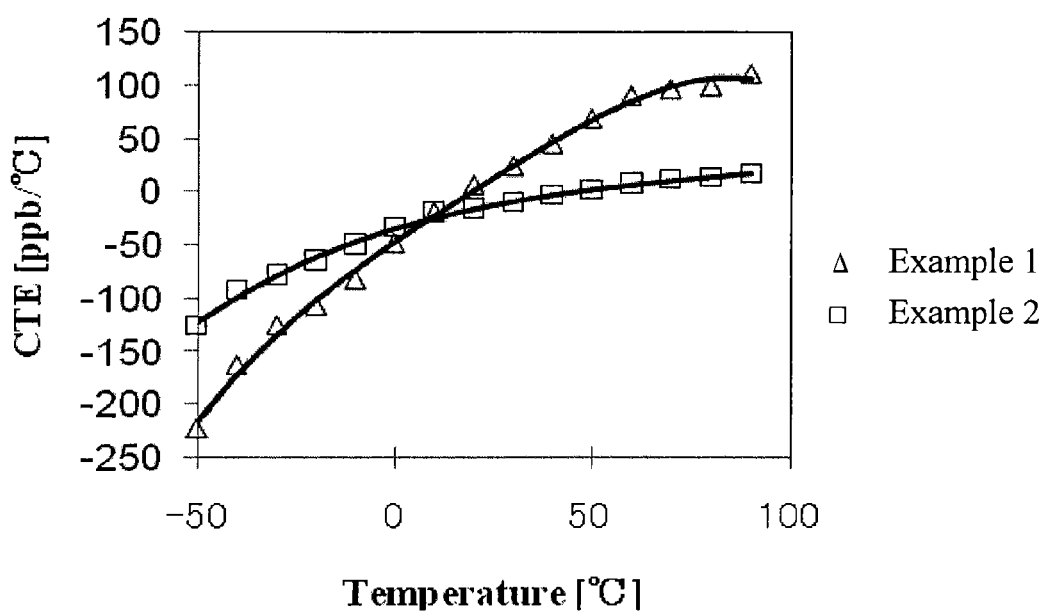
FIG. 2 is a graph showing CTE curves to temperature in respect to the glasses of Examples 1 and 2.

To achieve the above object, COTs of the two opposite surfaces of the substrate for EUVL optical member are preferably consistent with temperature of the incidence surface and temperature of its back surface at the time of irradiation with EUV light, respectively. However, so far as CTE distribution of the substrate for EUVL optical member is suppressed and CTE in the whole substrate for optical member is substantially zero at the time of irradiation with EUV light, temperature difference may occur between COTs of the two opposite surfaces of the substrate for optical member, and the temperature of the incidence surface and the temperature of its back surface at the time of irradiation with EVU light, respectively. The temperature difference varies depending on thermal expansion characteristics of a $TiO_2$—$SiO_2$ glass used as the substrate for optical member, and can appropriately be selected according to a slant of the CTE curve to temperature of the $TiO_2$—$SiO_2$ glass (curve obtained by plotting the relationship between CTE and temperature) as shown in FIG. 2.

The COT of the substrate for EUVL optical member can be determined from the CTE curve to temperature obtained by the following procedures. The substrate for EUVL optical member of the present invention comprises a $TiO_2$—$SiO_2$ glass as described below. Therefore, CTE of a sample is obtained by known technique, for example, from thermal expansion of the sample measured by rising temperature in a range of from −50 to +100° C. or in a wider range than the range, continuously or in a stepwise fashion with a range from 15 to 35° C. for each step, using a thermal dilatometer detecting elongation of the sample with a laser interferometer. Then, the relationship between CTE and temperature is plotted as shown in FIG. 2, thereby preparing a CTE curve to temperature.

In the present invention, between the two opposite surfaces have difference in the COTs of 5° C. or more. The COTs of the two opposite surfaces of the substrate for EUVL optical member are preferably consistent with temperature of the incidence surface and temperature of its back surface at the time of irradiation with EUV light, respectively. The difference of COTs between the two opposite surfaces is preferably 7° C. or more, and more preferably 10° C. or more.

In the case that the temperature difference between the incidence surface and the back surface at the time of irradiation with EUV light is less than 5° C., even though COT in the whole substrate for EUVL optical member is uniform over the whole substrate, CTE distribution occurred by the temperature difference is slight, and CTE in the whole substrate for optical member is substantially zero. Therefore, it is not necessary to bring the temperature difference to the COT in the two opposite surfaces.

The difference of COTs between the two opposite surfaces is preferably not more than 150° C. In the case where the difference of COTs exceeds 150° C., at least a portion is required to have COT of 170° C. or more. In order to set such a COT, the portion is required to have a $TiO_2$ concentration exceeding 10% by mass. In such a $TiO_2$ concentration, $TiO_2$ crystal is liable to generate.

As described above, the temperature of the mounting surface of EUVL optical member in an exposure tool for EUVL is controlled to 22±3° C. when carrying out EUVL. Therefore, the temperature of the surface 12 of the substrate for EUVL optical member shown in FIG. 1 may be 22±3° C. at the time of irradiation with EUV light.

Accordingly, one surface of the two opposite surfaces of the substrate for EUVL optical member preferably has COT of 22±3° C. In this case, the other surface preferably has COT of 5° C. or more higher, more preferably 7° C. or more higher, and further preferably 10° C. or more higher, than 22±3° C.

The substrate for EUVL optical member of the present invention has difference of 5° C. or more between COTs of the two opposite surfaces. Therefore, when the COT in the vicinity of one surface of the two opposite surfaces has difference of 5° C. or more with respect to COT in all of remaining portions of the substrate for optical member, CTE distribution in the substrate for optical member occurred by the temperature difference between the incidence surface side and the back surface side at the time of irradiation with EUV light can be suppressed.

However, when the temperature of the incidence surface side rises by the irradiation with EUV light, heat transfers in the substrate for optical member, and the temperature of portion other than the incidence surface of the substrate for optical member, specifically, the temperature of the inside of substrate for optical member, also rises. As a result, temperature gradient along a thickness direction of the substrate, more specifically temperature gradient such that the incidence surface side is high temperature and the back surface side is low temperature, occurs even in the inside of the substrate for optical member.

For this reason, it is preferred in the substrate for EUVL optical member of the present invention has COTs varying in a stepwise fashion or continuously from one surface toward the other surface. The term "the substrate has COTs varying in a stepwise fashion from one surface toward the other surface" used herein means that when COTs of the two opposite surfaces are referred to as COT1 and COT2 (COT1>COT2), respectively, a portion having COT (COTx) different from the COTs (COT1 and COT2) of the two opposite surfaces is present between the two opposite surfaces, that is, inside the substrate for optical member. However, this case should satisfy the following relationship.

COT1>COTx>COT2

For example, Examples 6 and 11 described below correspond to this embodiment.

Two or more portions having mutually different COT may be present inside the substrate for optical member. In this case, it is required that a portion having higher COT is located at a side close to the surface having COT1, and a portion having lower COT is located at a side close to the surface having COT2.

On the other hand, the term "substrate has COTs varying continuously from one surface toward the other surface" used herein means that COT increases continuously or decreases continuously along the thickness direction of the substrate for optical member. For example, Examples 7 and 12 described below correspond to this embodiment.

In this case, COT may increase or decrease linearly, and may be increase or decrease in a form of exponential curve.

The substrate for EUVL optical member of the present invention comprises a $TiO_2$—$SiO_2$ glass. The reason is that since $TiO_2$—$SiO_2$ glass is known as an extremely low thermal expansion material having CTE lower than that of a quartz glass and since the CTE can be controlled by a $TiO_2$ concentration in the glass, a zero-expansion glass whose CTE is close to zero can be obtained.

A glass having a $TiO_2$ concentration of from 3% to 10% by mass is preferably used as the $TiO_2$—$SiO_2$ glass. Where the $TiO_2$ concentration is less than 3% by mass, COT possibly is less than 15° C. The $TiO_2$ concentration is preferably 5% by mass or more, and more preferably 6% by mass or more. On the other hand, where the $TiO_2$ concentration exceeds 10% by mass, $TiO_2$ crystal is liable to generate.

The term "$TiO_2$ concentration" used herein means the $TiO_2$ concentration in individual portions of the $TiO_2$—$SiO_2$ glass, and it is preferred that the individual portions of the $TiO_2$—$SiO_2$ glass satisfy the above $TiO_2$ concentration.

It is known in the $TiO_2$—$SiO_2$ glass that a coefficient of linear thermal expansion changes by the $TiO_2$ concentration (P. C. Schultz and H. T. Smyth, in: R. W. Douglas and B. Ellis, Amorphous Materials, Willey, N.Y., p. 453 (1972)).

Therefore, COT of the $TiO_2$—$SiO_2$ glass can be controlled in each and every site of the $TiO_2$—$SiO_2$ glass by controlling the $TiO_2$ concentration of the $TiO_2$—$SiO_2$ glass used as a substrate for EUVL optical member in each and every site of the $TiO_2$—$SiO_2$ glass. A method for controlling the $TiO_2$ concentration of the $TiO_2$—$SiO_2$ glass in each and every site of the $TiO_2$—$SiO_2$ glass includes a method of controlling feed proportion of an $SiO_2$ precursor and a $TiO_2$ precursor each serving as a glass forming raw material, in producing a porous $TiO_2$—$SiO_2$ glass body by a soot process or in producing a $TiO_2$—$SiO_2$ glass body by a direct process.

Furthermore, a $TiO_2$—$SiO_2$ glass having different $TiO_2$ concentration depending on a portion can be obtained by joining $TiO_2$—$SiO_2$ glasses having different $TiO_2$ concentration with each other.

Moreover, a $TiO_2$—$SiO_2$ glass having different $TiO_2$ concentration depending on a portion can also be obtained by obtaining a $TiO_2$—$SiO_2$ glass body by laminating and solidifying $TiO_2$—$SiO_2$ glass fine particles having different $TiO_2$ concentration.

As described in JP-A-2005-104820, the present inventors found that there is a relationship between a fictive temperature of a $TiO_2$—$SiO_2$ glass and CTE characteristics of the $TiO_2$—$SiO_2$ glass. In other words, they found that there is a relationship between a fictive temperature of a $TiO_2$—$SiO_2$ glass and COT of the $TiO_2$—$SiO_2$ glass. More specifically, they found that in the case of $TiO_2$—$SiO_2$ glasses having the same $TiO_2$ concentration, COT decreases along with an increase of the fictive temperature, and COT is increases along with a decrease of the fictive temperature. They further found that there is a relationship between a fictive temperature of a $TiO_2$—$SiO_2$ glass and a gradient of CTE of the $TiO_2$—$SiO_2$ glass to temperature. More specifically, the gradient of CTE to temperature decreases, and temperature region in which CTE is substantially 0 ppb/° C. widens along with a decrease of the fictive temperature. Therefore, the characteristics of CTE of the $TiO_2$—$SiO_2$ glass can be controlled by controlling the fictive temperature of the $TiO_2$—$SiO_2$ glass used as a substrate for EUVL optical member.

A method for controlling a fictive temperature of a $TiO_2$—$SiO_2$ glass in each and every site of the $TiO_2$—$SiO_2$ glass is as followed. For example, a fictive temperature of a $TiO_2$—$SiO_2$ glass can be controlled in each and every site by changing a temperature-decreasing rate on one surface of a transparent glass body and a temperature-decreasing rate of other surface thereof in a step (e) in production procedures of a $TiO_2$—$SiO_2$ glass described below. Specific example of this procedure includes a method of rapidly cooling one surface of a transparent glass body in the annealing step. Furthermore, a $TiO_2$—$SiO_2$ glass having different fictive temperature depending on a portion can be obtained by joining $TiO_2$—$SiO_2$ glasses having different fictive temperature with each other.

The fictive temperature of the $TiO_2$—$SiO_2$ glass used as a substrate for optical member is preferably lower than 1,150° C. When the fictive temperature of the $TiO_2$—$SiO_2$ glass is lower than 1,150° C., there is the advantage that because a gradient of CTE of the $TiO_2$—$SiO_2$ glass at from 20° C. to 100° C. with respect to temperature becomes small, even in the case that a $TiO_2$ concentration is varied in a stepwise fashion (not continuously) between the two opposite surfaces of the $TiO_2$—$SiO_2$ glass, a portion where CTE is not substantially zero is hardly generated in the $TiO_2$—$SiO_2$ glass at the time of irradiation with EUV light. In the case that the $TiO_2$ concentration was varied continuously between the two opposite surfaces, there is the advantage that even in the case that difference occurs between the variation of the $TiO_2$ concentration in the $TiO_2$—$SiO_2$ glass and an assumed temperature gradient in a thickness direction of the $TiO_2$—$SiO_2$ glass, a portion that CTE is not substantially zero is difficult to occur in the $TiO_2$—$SiO_2$ glass at the time of irradiation with EUV light. The CTE is difficult to deviate from zero at the time of irradiation with EUV light.

The fictive temperature of the $TiO_2$—$SiO_2$ glass is more preferably lower than 1,100° C., further preferably lower than 1,000° C., and particularly preferably lower than 850° C.

The term "fictive temperature" used herein means the fictive temperature in individual portions of the $TiO_2$—$SiO_2$ glass, and it is preferred that the individual portions of the $TiO_2$—$SiO_2$ glass satisfy the above fictive temperature.

The fictive temperature of the $TiO_2$—$SiO_2$ glass can be controlled by, for example, the annealing step (e) in production procedures of the $TiO_2$—$SiO_2$ glass described below. Specifically, when the glass is subjected to temperature decrease at slower average temperature-decreasing rate in the annealing step (e), lower fictive temperature is achieved. Specifically, in order to more decrease the fictive temperature, it is preferred that the glass is subjected to temperature decreased at an average temperature-decreasing rate of 3° C./hr or less, and it is more preferred that the glass is subjected to temperature decrease at an average temperature-decreasing rate of 1° C./hr or less.

The fictive temperature of the $TiO_2$—$SiO_2$ glass can be measured by the known procedures. In the Examples described below, the fictive temperature of the $TiO_2$—$SiO_2$ glass was measured by the following procedures.

With respect to a mirror-polished $TiO_2$—$SiO_2$ glass, an absorption spectrum is obtained by an infrared spectrometer (Magna 760, manufactured by Nikolet Company was used in the Examples as described below). In this measurement, a data-taking interval is set up at about 0.5 $cm^{-1}$, and an average value obtained by scanning 64 times is employed for the absorption spectrum. In the thus obtained absorption spectrum, a peak observed in the vicinity of about 2,260 $cm^{-1}$ is attributed to an overtone of stretching vibration by an Si—O—Si bond of the $TiO_2$—$SiO_2$ glass. A calibration curve is prepared from glasses of the same compositions having known fictive temperatures by using this peak position, thereby determining the fictive temperature of the measured $TiO_2$—$SiO_2$ glass.

In the present invention, any of the above-described two methods, that is, a method of controlling a $TiO_2$ concentration of the $TiO_2$—$SiO_2$ glass and a method of controlling a fictive temperature of the $TiO_2$—$SiO_2$ glass, is used as a method of controlling COT of the TiO$_2$—SiO$_2$ glass used as the substrate for EUVL optical member, and those two method may be combined.

The TiO$_2$—SiO$_2$ glass used as the substrate for EUVL optical member may contain F.

It has already been known in an SiO$_2$ glass that addition of F affects structural relaxation of the glass (*Journal of Applied Physics*, 91(8), 4886 (2002)). According to this literature, structural relaxation time of the glass is accelerated by the addition of F, and thereby making it easy to realize a glass structure having low fictive temperature.

Furthermore, it is considered that the addition of F has the effect of decreasing a gradient of CTE to temperature.

In order to decrease a fictive temperature of a TiO$_2$—SiO$_2$ glass, the F concentration is preferably 1,000 ppm or more, more preferably 3,000 ppm or more, and further preferably 5,000 ppm or more.

However, in the case that the F concentration is too high, CTE rises. Therefore, the F concentration is preferably 30,000 ppm or less, and more preferably 20,000 ppm or less.

The term "F concentration" used herein means the F concentration in individual portions of the TiO$_2$—SiO$_2$ glass, and it is preferred that the individual portions of the TiO$_2$—SiO$_2$ glass satisfy the above F concentration.

The F concentration can be measured by a known method, and, for example, can be measured by the following procedures. TiO$_2$—SiO$_2$ glass is melted by heating anhydrous sodium carbonate. Distilled water and hydrochloric acid are added to the resulting melt in a volume ratio to the melt of 1, respectively, thereby preparing a sample liquid. An electromotive force of the sample liquid is measured with a radiometer by using No. 945-220 and No. 945-468, manufactured by Radiometer Trading Co., Ltd., as an F ion-selective electrode and a reference electrode, respectively, and the F concentration is determined on the basis of a calibration curve which has been previously prepared (Nippon Kagaku Kaishi, 1972 (2), 350). The detection limit by this method is 10 ppm.

A method for producing a TiO$_2$—SiO$_2$ glass containing F is described below. There are the following some methods. One example is a production method comprising obtaining a porous TiO$_2$—SiO$_2$ glass body by a step (a) in the production procedures of a TiO$_2$—SiO$_2$ glass described below, treating the obtained porous TiO$_2$—SiO$_2$ glass body in an F-containing atmosphere, and then heating the glass body to a transparent glass formation temperature or higher. This method is described in detail below.

Other example of obtaining a TiO$_2$—SiO$_2$ glass body containing F is a production method comprising using F-containing materials as an SiO$_2$ precursor and a TiO$_2$ precursor each serving as a glass forming raw material, or subjecting an SiO$_2$ precursor and a TiO$_2$ precursor to flame hydrolysis or thermal decomposition in an F-containing atmosphere, in the step (a) in the production procedures of a TiO$_2$—SiO$_2$ glass described below, thereby obtaining a porous TiO$_2$—SiO$_2$ glass body containing F.

Further example of obtaining a TiO$_2$—SiO$_2$ glass containing F is a production method by a direct method, comprising using F-containing materials as an SiO$_2$ precursor and a TiO$_2$ precursor each serving as a glass forming raw material, or subjecting an SiO$_2$ precursor and a TiO$_2$ precursor to hydrolysis and oxidation in oxyhydrogen flame at from 1,800 to 2,000° C. in an F-containing atmosphere.

The TiO$_2$—SiO$_2$ glass used as the substrate for optical member may contain OH.

Structural relaxation of a glass is accelerated by the addition of OH, and thereby making it easy to realize a glass structure having low fictive temperature. Therefore, incorporation of OH is effective means to decrease a fictive temperature of the TiO$_2$—SiO$_2$ glass.

In order to decrease the fictive temperature of the TiO$_2$—SiO$_2$ glass, the OH concentration is preferably 600 ppm or more, more preferably 1,000 ppm or more, and further preferably 1,300 ppm or more. The OH concentration is preferably 1500 ppm or less. In the case where the OH concentration exceeds 1500 ppm, a crack is liable to generate.

The term "OH concentration" used herein means the OH concentration in individual portions of the TiO$_2$—SiO$_2$ glass, and it is preferred that the individual portions of the TiO$_2$—SiO$_2$ glass satisfy the above-described OH concentration.

The OH concentration in the TiO$_2$—SiO$_2$ glass can be measured using a known method. For example, the OH concentration can be obtained from an absorption peak at a wavelength of 2.7 μm by the measurement with an infrared spectrophotometer (J. P. Williams et. al., American Ceramic Society Bulletin, 55(5), 524, 1976). The detection limit by this method is 0.1 ppm.

The TiO$_2$—SiO$_2$ glass containing OH is produced by, for example, the following method. One example is a production method comprising obtaining a porous TiO$_2$—SiO$_2$ glass body in the step (a) of production procedures of a TiO$_2$—SiO$_2$ glass described below, treating the obtained porous TiO$_2$—SiO$_2$ glass body in a water vapor-containing atmosphere, heating the glass body to a densification temperature or higher in the water vapor-containing atmosphere, and then further heating the glass body to a transparent vitrification temperature or higher, thereby obtaining a TiO$_2$—SiO$_2$ glass containing OH. This method is described in detail below.

In order to produce the TiO$_2$—SiO$_2$ glass used as a substrate for EUVL optical member, a production method including the following steps (a) to (e) can be adopted.

Step (a): Preparation Step

TiO$_2$—SiO$_2$ glass fine particles obtained through flame hydrolysis of an SiO$_2$ precursor and a TiO$_2$ precursor each serving as a glass-forming raw material are deposited and grown on a substrate, thereby forming a porous TiO$_2$—SiO$_2$ glass body. The glass-forming raw material is not particularly limited so far as it is a raw material capable of being gasified. Examples of the SiO$_2$ precursor include chlorides such as SiCl$_4$, SiHCl$_3$, SiH$_2$Cl$_2$ or SiH$_3$Cl, fluorides such as SiF$_4$, SiHF$_3$ or SiH$_2$F$_2$, and alkoxysilanes represented by R$_n$Si(OR)$_{4-n}$ (wherein R represents an alkyl group having from 1 to 4 carbon atoms; n is an integer of from 0 to 3; and the plural R's may be the same or different). Examples of the TiO$_2$ precursor include titanium halides such as TiCl$_4$, and alkoxy titaniums represented by R$_n$Ti(OR)$_{4-n}$ (wherein R represents an alkyl group having from 1 to 4 carbon atoms; n is an integer of from 0 to 3; and the plural R's may be the same or different).

A substrate for EUVL optical member in which COT varies in a stepwise fashion or continuously between the two opposite surfaces can be obtained by changing the feeding proportions of the SiO$_2$ precursor and the TiO$_2$ precursor with the passage of time in the step (a).

In order to obtain a TiO$_2$—SiO$_2$ glass containing F, the porous TiO$_2$—SiO$_2$ glass body obtained by the above procedures can be treated in an F-containing atmosphere. The F-containing atmosphere is preferably an inert gas atmosphere containing F gas (for example, SiF$_4$, SF$_6$, CHF$_3$, CF$_4$, C$_2$F$_6$, C$_3$F$_8$ or F$_2$) in an amount of from 0.1% to 100% by volume.

The treatment is preferably conducted at room temperature or high temperature of a transparent vitrification temperature described below or lower under a pressure of from 10,000 Pa to 100,000 Pa (about 1 atom) for from several ten minutes to several hours in the above atmosphere.

For example, in the case of using $SiF_4$ as the F-containing atmosphere, a treatment temperature and a treatment time are set as follows in conformity with a desired amount of F to be contained in the porous $TiO_2$—$SiO_2$ glass body.

In the case that the F content is desired to be from 1,000 ppm to less than 3,000 ppm, it can be achieved by holding the glass body in a gas atmosphere containing F gas in an amount of from 2% to 10% by volume at from 500° C. to 1,000° C. for from 2 hours to several ten hours. In the case that the F content is desired to be from 3,000 ppm to 7,000 ppm, it can be achieved by holding the glass body in a gas atmosphere containing F gas in an amount of from 5% to several ten % by volume at from 800° C. to 1,100° C. for from 2 hours to several ten hours. In the case that the F content is desired to be more than 7,000 ppm, it can be achieved by holding the glass body in a gas atmosphere containing F gas in an amount of from 5% to several ten % by volume at 1,000° C. or higher for from 2 hours to several ten hours.

The unit "Pa" in the present specification does not mean a gauge pressure, but means an absolute pressure.

In the case that F is incorporated into a synthetic quartz glass prepared by the soot method as is conventionally done, it is pointed out that when F is incorporated at high temperature, oxygen deficient defect is generated, resulting in decrease of light transmittance. However, in the case that the glass is used as an optical member used in a reflecting optical system, the decrease of light transmittance does not become the problem. Therefore, it becomes possible to introduce an extremely large amount of F by treating at high temperature of a transparent vitrification temperature or lower, and the F content can be several thousand ppm or more in the maximum amount.

Step (b): Densification Step

The porous $TiO_2$—$SiO_2$ glass body obtained in the above step (a), or the porous $TiO_2$—$SiO_2$ glass body containing fluorine obtained by treating the porous $TiO_2$—$SiO_2$ glass body obtained in the above step (a) in the F-containing atmosphere is heated to the densification temperature, thereby obtaining a $TiO_2$—$SiO_2$ dense body substantially free of foams and air bubbles. The phrase "a $TiO_2$—$SiO_2$ dense body substantially free of foams and air bubbles" means that the $TiO_2$—$SiO_2$ dense body does not contain foams and air bubbles having a size of 100 μm or more which are detectable by visual inspection. The densification temperature is preferably from 1,100° C. to 1,750° C., and more preferably from 1,200° C. to 1,550° C. In the case of normal pressure, the atmosphere is preferably an atmosphere of 100% inert gas such as helium, or an atmosphere comprising an inert gas such as helium as a main component. In the case of reduced pressure, the atmosphere is not particularly limited.

In order to obtain the $TiO_2$—$SiO_2$ glass containing OH, the porous $TiO_2$—$SiO_2$ glass body obtained by the above step (a) is heated to a densification temperature in a water vapor-containing atmosphere, thereby obtaining a $TiO_2$—$SiO_2$ dense body containing OH. The densification temperature is generally from 1,250° C. to 1,550° C., and particularly preferably from 1,300° C. to 1,500° C. In the case that the OH content is 600 ppm or more, viscosity of a glass is decreased, and the densification temperature is decreased. For this reason, the densification temperature is preferably from 1,250° C. to 1,450° C., and particularly preferably from 1,300° C. to 1,400° C. The water vapor-containing atmosphere is preferably an inert gas atmosphere in which a water vapor partial pressure ($P_{H2O}$) is from 50,000 Pa to 1,000,000 Pa. The inert gas is preferably helium.

The treatment is preferably conducted under a pressure of about from 50,000 Pa to 1,000,000 Pa in the above atmosphere.

Step (c): Vitrification Step

The dense glass body obtained in the step (b) is heated to a transparent vitrification temperature, thereby obtaining a transparent glass body. The transparent vitrification temperature is generally from 1,250° C. to 1,750° C., and particularly preferably from 1,300° C. to 1,700° C.

In the case that the $TiO_2$—$SiO_2$ glass body contains F, when the F content is high, specifically when the F content is 1,000 ppm or more, viscosity of the glass is decreased and the transparent vitrification temperature is decreased. Therefore, the transparent vitrification temperature is preferably from 1,250° C. to 1,650° C., and particularly preferably from 1,300° C. to 1,600° C.

In the case that the $TiO_2$—$SiO_2$ glass body contains OH, when the OH content is high, specifically when the OH content is 600 ppm or more, viscosity of the glass is decreased and the transparent vitrification temperature is decreased. Therefore, the transparent vitrification temperature is preferably from 1,250° C. to 1,650° C., and particularly preferably from 1,300° C. to 1,600° C.

The atmosphere is preferably an atmosphere of 100% of an inert gas such as helium or argon, or an atmosphere comprising an inert gas such as helium as a main component. The pressure can be reduced pressure or normal pressure. Particularly, in the case of the normal pressure, a helium gas or argon can be used. In the case of the reduced pressure, the pressure is preferably 13,000 Pa or less. In order to introduce F of higher concentration into a glass, the atmosphere preferably contains an F-containing gas.

Step (d): Forming Step

The transparent glass body obtained in the step (c) is heated to temperature of the softening point or higher and formed in a desired shape, thereby obtaining a formed glass body. The temperature at forming process is preferably from 1,500° C. to 1,800° C. The step (c) and the step (d) can be conducted continuously or simultaneously. Furthermore, a two-step forming may be carried out that the transparent glass body obtained in the step (c) is placed in a mold and heated to temperature of the softening point or higher, and the formed product obtained is placed in other mold and heated to temperature of the softening point or higher. In the case that the shape of the glass body obtained in the step (c) is not required to change, the step (d) may be omitted.

Step (e): Annealing Step

The transparent glass body obtained in the step (c) or the step (d) is held at a temperature of from more than 500° C. to 1,200° C. for 2 hours or more, and then subjected to an annealing treatment for decreasing the temperature to 500° C. or lower at an average temperature-decreasing rate of 5° C./hr or less, thereby controlling the fictive temperature of the glass. Alternatively, the glass body obtained in the step (c) or the step (d) is subjected to an annealing treatment for decreasing the temperature to 500° C. or lower at an average temperature-decreasing rate of 5° C./hr or less, thereby controlling the fictive temperature of the $TiO_2$—$SiO_2$ glass. After decreasing the temperature to 500° C. or lower, natural cooling can be adoptable. The atmosphere in this case is preferably an atmosphere of 100% of an inert gas such as helium, argon or nitrogen, an atmosphere comprising such an inert gas as a main component, or an air atmosphere. The pressure is preferably reduced pressure or normal pressure.

For the purpose of attaining lower fictive temperature, it is effective that temperature is decreased at slower temperature-decreasing rate in a temperature region in the vicinity of an annealing point or a strain point of the glass. Specifically, in the temperature-decreasing profile of the step (e), the slowest temperature-decreasing rate is preferably 1° C./hr or less, more preferably 0.5° C./hr or less, and particularly preferably 0.3° C./hr.

EXAMPLES

The present invention is described in more detail below by reference to the following Examples, but the invention should not be construed as being limited thereto.

Example 1

$TiO_2$—$SiO_2$ glass fine particles obtained by gasifying $TiCl_4$ and $SiCl_4$ each serving as a glass-forming raw material of a $TiO_2$—$SiO_2$ glass, respectively, mixing those such that an average $TiO_2$ concentration after vitrification is 6.68% ("%" means "% by mass"; the same shall apply hereinafter), and then subjecting the resulting mixture to heat hydrolysis (flame hydrolysis) in oxyhydrogen flame were deposited and grown on a substrate, thereby forming a porous $TiO_2$—$SiO_2$ glass body (step (a)). Since it was hard to handle the obtained porous $TiO_2$—$SiO_2$ glass body without any treatment, the obtained porous $TiO_2$—$SiO_2$ glass body was kept in air at 1,200° C. for 4 hours together with the substrate, and then separated from the substrate.

Thereafter, the porous $TiO_2$—$SiO_2$ glass body was placed in an atmosphere-controllable electric furnace, and the pressure in the electric furnace was reduced to 1,330 Pa at room temperature. Thereafter, the porous $TiO_2$—$SiO_2$ glass body was heated to 1,450° C. in a helium gas atmosphere, and kept at this temperature for 4 hours, thereby obtaining a $TiO_2$—$SiO_2$ dense body (step (b)).

The obtained $TiO_2$—$SiO_2$ dense body was heated to 1,680° C. and kept for 4 hours in an argon atmosphere under normal pressure using carbon furnace, thereby obtaining a transparent glass body (step (c)).

The obtained transparent glass body was placed in a carbon mold, heated to 1,700° C. in an argon atmosphere under normal pressure, and formed into a block shape, thereby obtaining a formed glass body (step (d)).

The obtained formed glass body was kept at 1,100° C. for 5 hours in air, subjected to temperature decrease to 900° C. at a rate of 1° C./hr, further subjected to temperature decrease to 500° C. at a rate of 5° C./hr, and then allowed to stand for natural cooling (step (e)). FIG. 2 is a CTE curve to temperature of the $TiO_2$—$SiO_2$ glass of Example 1, and the curve is obtained by plotting the relationship between CTEs and temperatures of the transparent $TiO_2$—$SiO_2$ glass body after carrying out the step (e).

$TiO_2$ concentration of the transparent $TiO_2$—$SiO_2$ glass body, obtained using a fundamental parameter method in a fluorescent X-ray spectroscopy was 6.68%. F concentration by the above measurement method was lower than the measurement limit, and the fictive temperature was 960° C.

Example 2

$TiO_2$—$SiO_2$ glass fine particles obtained by gasifying $TiCl_4$ and $SiCl_4$ each serving as a glass-forming raw material of a $TiO_2$—$SiO_2$ glass, respectively, mixing those such that an average $TiO_2$ concentration after vitrification is 6.86%, and then subjecting the resulting mixture to heat hydrolysis (flame hydrolysis) in oxyhydrogen flame were deposited and grown on a substrate, thereby forming a porous $TiO_2$—$SiO_2$ glass body (step (a)).

Since it was hard to handle the obtained porous $TiO_2$—$SiO_2$ glass body without any treatment, the obtained porous $TiO_2$—$SiO_2$ glass body was kept in air at 1,200° C. for 4 hours together with the substrate, and then separated from the substrate.

Thereafter, the porous $TiO_2$—$SiO_2$ glass body was placed in an atmosphere-controllable electric furnace, and the pressure in the electric furnace was reduced to about 1,000 Pa at room temperature. Thereafter, while a mixed gas of $He/O_2/SiF_4$=88/2/10 (volume ratio) was introduced into the electric furnace, the porous $TiO_2$—$SiO_2$ glass body was kept in this atmosphere at 1,000° C. for 4 hours under normal pressure, and thereby incorporating F into the porous $TiO_2$—$SiO_2$ glass body.

Thereafter, the porous $TiO_2$—$SiO_2$ glass body was placed in an atmosphere-controllable electric furnace, and the pressure in the electric furnace was reduced to 1,330 Pa at room temperature. Thereafter, the porous $TiO_2$—$SiO_2$ glass body was heated to 1,450° C. in a helium gas atmosphere, and kept at this temperature for 4 hours, thereby obtaining a $TiO_2$—$SiO_2$ dense body (step (b)).

The obtained $TiO_2$—$SiO_2$ dense body was heated to 1,700° C. and kept for 4 hours in an argon atmosphere under normal pressure using a carbon furnace, thereby obtaining a transparent glass body (step (c)).

The obtained transparent glass body was kept at 1,000° C. for 10 hours in air, subjected to temperature decrease to 300° C. at a rate of 5° C./hr, and then cooled in air (step (e)).

FIG. 2 is a CTE curve to temperature, of the $TiO_2$—$SiO_2$ glass of Example 2, obtained by plotting the relationship between CTEs and temperatures of the transparent $TiO_2$—$SiO_2$ glass body after carrying out the step (e).

$TiO_2$ concentration of the transparent $TiO_2$—$SiO_2$ glass body, obtained using a fundamental parameter method in a fluorescent X-ray spectroscopy was 6.86%. F concentration by the above measurement method was 8,690 ppm, and the fictive temperature was 750° C.

Example 3

Transparent $TiO_2$—$SiO_2$ glass body is obtained in the same manner as in Example 1 except that $TiCl_4$ and $SiCl_4$ are gasified respectively and mixed those such that an average $TiO_2$ concentration after vitrification is 6.71%, in the step (a).

Example 4

Transparent $TiO_2$—$SiO_2$ glass body is obtained in the same manner as in Example 1, except that $TiCl_4$ and $SiCl_4$ are gasified respectively and mixed such that an average $TiO_2$ concentration after vitrification is 8.05%, in the step (a).

Example 5

Transparent $TiO_2$—$SiO_2$ glass body is obtained in the same manner as in Example 1, except that in step (a), during the period of 12 hours from initiation of the preparation, $TiCl_4$ and $SiCl_4$ are gasified respectively and mixed such that an average $TiO_2$ concentration after vitrification is 8.05%, and during the period of from 12 hours after to 24 hours after initiation of the preparation, $TiCl_4$ and $SiCl_4$ are gasified respectively and mixed such that an average $TiO_2$ concentration after vitrification is 6.71%.

Example 6

Transparent $TiO_2$—$SiO_2$ glass body is obtained in the same manner as in Example 1, except that in step (a), $TiCl_4$ and SiCl₄ are gasified respectively and mixed, wherein the mixing rate is varied in a stepwise fashion so that during the period of 2.5 hours from initiation of the preparation, they are mixed such that an average TiO$_2$ concentration after vitrification is 8.05%; during the period of from 2.5 hours after to 7.5 hours after initiation of the preparation, they are mixed such that an average TiO$_2$ concentration after vitrification is 7.80%; during the period of from 7.5 hours after to 12.5 hours after initiation of the preparation, they are mixed such that an average TiO$_2$ concentration after vitrification is 7.54%; during the period of from 12.5 hours after to 17.5 hours after initiation of the preparation, they are mixed such that an average TiO$_2$ concentration after vitrification is 7.28%; during the period of from 17.5 hours after to 22.5 hours after initiation of the preparation, they are mixed such that an average TiO$_2$ concentration after vitrification is 7.00%; and during the period of from 22.5 hours after to 25 hours after initiation of the preparation, they are mixed such that an average TiO$_2$ concentration after vitrification is 6.71%.

Example 7

Transparent TiO$_2$—SiO$_2$ glass body is obtained in the same manner as in Example 1, except that in the step (a), TiCl$_4$ and SiCl$_4$ are gasified respectively and mixed, wherein the mixing rate is continuously varied so that at the time of initiation of the preparation, they are mixed such that an average TiO$_2$ concentration after vitrification is 8.05%, and at 25 hours after initiation of the preparation, they are mixed such that an average TiO$_2$ concentration after vitrification is 6.71%.

Example 8

Transparent TiO$_2$—SiO$_2$ glass body is obtained in the same manner as in Example 2, except that TiCl$_4$ and SiCl$_4$ are gasified respectively and mixed such that an average TiO$_2$ concentration after vitrification is 6.48%, in the step (a).

Example 9

Transparent TiO$_2$—SiO$_2$ glass body is obtained in the same manner as in Example 2, except that TiCl$_4$ and SiCl$_4$ are gasified respectively and mixed such that an average TiO$_2$ concentration after vitrification is 7.13%, in the step (a).

Example 10

Transparent TiO$_2$—SiO$_2$ glass body is obtained in the same manner as in Example 2, except that in step (a), during the period of 12 hours from initiation of the preparation, TiCl$_4$ and SiCl$_4$ are gasified respectively and mixed such that an average TiO$_2$ concentration after vitrification is 7.13%, and during the period of from 12 hours after to 24 hours after initiation of the preparation, TiCl$_4$ and SiCl$_4$ are gasified respectively and mixed such that an average TiO$_2$ concentration after the vitrification is 6.48%.

Example 11

Transparent TiO$_2$—SiO$_2$ glass body is obtained in the same manner as in Example 2, except that in step (a), TiCl$_4$ and SiCl$_4$ are gasified respectively and mixed, wherein the mixing rate is varied in a stepwise fashion so that during the period of 2.5 hours from initiation of the preparation, they are mixed such that an average TiO$_2$ concentration after vitrification is 7.13%; during the period of from 2.5 hours after to 7.5 hours after initiation of the preparation, they are mixed such that an average TiO$_2$ concentration after vitrification is 7.03%; during the period of from 7.5 hours after to 12.5 hours after initiation of the preparation, they are mixed such that an average TiO$_2$ concentration after vitrification is 6.92%; during the period of from 12.5 hours after to 17.5 hours after initiation of the preparation, they are mixed such that an average TiO$_2$ concentration after vitrification is 6.79%; during the period of from 17.5 hours after to 22.5 hours after initiation of the preparation, they are mixed such that an average TiO$_2$ concentration after vitrification is 6.65%; and during the period of from 22.5 hours after to 25 hours after initiation of the preparation, they are mixed such that an average TiO$_2$ concentration after vitrification is 6.48%.

Example 12

Transparent TiO$_2$—SiO$_2$ glass body is obtained in the same manner as in Example 7, except that in step (a), TiCl$_4$ and SiCl$_4$ are gasified respectively and mixed, wherein the mixing rate is continuously varied so that at the time of initiation of the preparation, they are mixed such that an average TiO$_2$ concentration after vitrification is 7.13%, and at 25 hours after initiation of the preparation, they are mixed such that an average TiO$_2$ concentration after vitrification is 6.48%.

Regarding the TiO$_2$—SiO$_2$ glasses produced in Examples 3 to 12 (transparent TiO$_2$—SiO$_2$ glass bodies), CTE distributions are shown in FIGS. 3 to 6 in the case that one surface of each glass is irradiated with EUV light, thereby temperature difference of 50° C. (incidence surface temperature: 70° C., back surface temperature: 20° C.) is generated between the incidence surface and the back surface, and the temperature is continuously varied owing to heat transfer in the glass inside. In the graphs shown in FIGS. 3 to 6, the horizontal axis indicates temperature variation in thickness direction of a glass from an incidence surface to a back surface. The right edge of the horizontal axis corresponds to the incidence surface, and the left edge thereof corresponds to the back surface.

In the case that a fictive temperature and an F concentration are constant, the relationship represented by the following formula is established between TiO$_2$ concentration of TiO$_2$—SiO$_2$ glass and CTE (CTE(T)) at each temperature.

$$CTE(T)(ppb) = A(T) \times TiO_2 \text{ concentration}(\% \text{ by mass}) + B(T)$$

wherein A(T) and B(T) are variable numbers by temperature.

CTE to each temperature is calculated utilizing the relationship shown by the above formula and the CTE curve to temperature, of TiO$_2$—SiO$_2$ glass, shown in FIG. 2. the A(T) and B(T) are obtained by measuring CTE for 4 or more TiO$_2$—SiO$_2$ glasses produced in such a manner that they have the same fictive temperature and the same F content and have difference in TiO$_2$ concentration.

The TiO$_2$—SiO$_2$ glasses produced in Examples 3 to 7 are supposed to be used as a substrate of a lightening system mirror, and it is required to satisfy that CTE in the whole TiO$_2$—SiO$_2$ glass is ±50 ppb/° C. at the time of irradiation with EUV light. On the other hand, the TiO$_2$—SiO$_2$ glasses produced in Examples 8 to 12 are supposed to be used as a substrate of a projection system mirror, and it is required to satisfy that CTE in the whole TiO$_2$—SiO$_2$ glass is ±25 ppb/° C. at the time of irradiation with EUV light.

Characteristics of the TiO$_2$—SiO$_2$ glasses produced in Examples 1 and 12 are shown in Table 1.

TABLE 1

|  | TiO$_2$ concentration (%) | F concentration (ppm) | Fictive temperature (° C.) | COT (° C.) |
|---|---|---|---|---|
| Example 1 | 6.68 | N.D. | 960 | 19.1 |
| Example 2 | 6.86 | 8690 | 750 | 45.1 |
| Example 3 | 6.71 | N.D. | 960 | 20 |
| Example 4 | 8.05 | N.D. | 960 | 70 |
| Example 5 | 8.05/6.71 | N.D. | 960 | 70/20 |
| Example 6 | 8.05/7.80/7.54/ 7.28/7.00/6.71 | N.D. | 960 | 70/60/50/ 40/30/20 |
| Example 7 | Continuously vary from 8.05 to 6.71 | N.D. | 960 | Continuously vary from 70 to 20 |
| Example 8 | 6.48 | 8690 | 750 | 20 |
| Example 9 | 7.13 | 8690 | 750 | 70 |
| Example 10 | 7.13/6.48 | 8690 | 750 | 70/20 |
| Example 11 | 7.13/7.03/6.92/ 6.79/6.65/6.48 | 8690 | 750 | 70/60/50/ 40/30/20 |
| Example 12 | Continuously vary from 7.13 to 6.48 | 8690 | 750 | Continuously vary from 70 to 20 |

Figure 3:
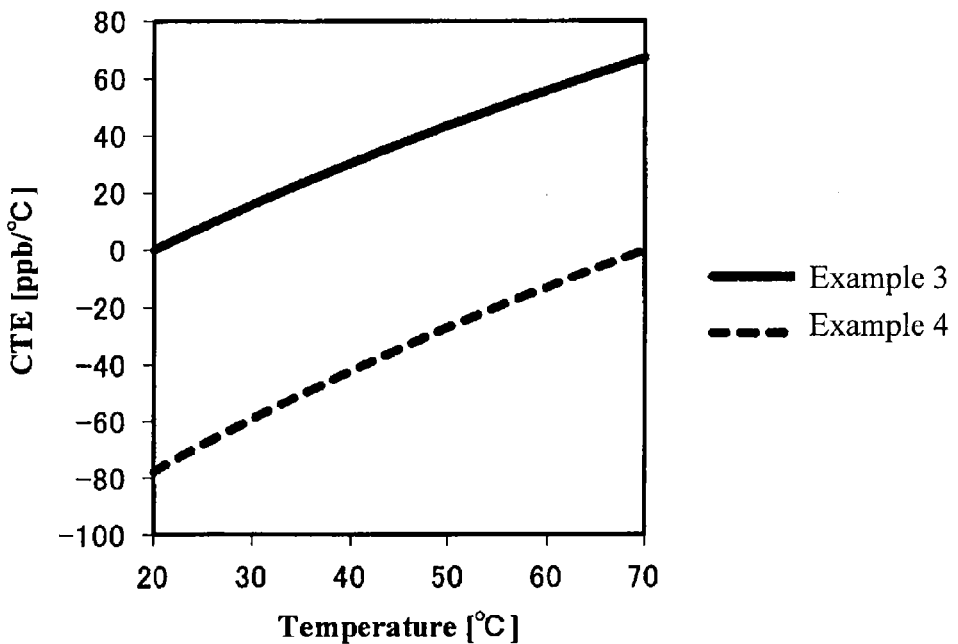
FIG. 3 is a graph showing CTE distributions in respect to the glasses of Examples 3 and 4 when temperature difference of 50° C. occurred between two opposite surfaces.
Figure 4:
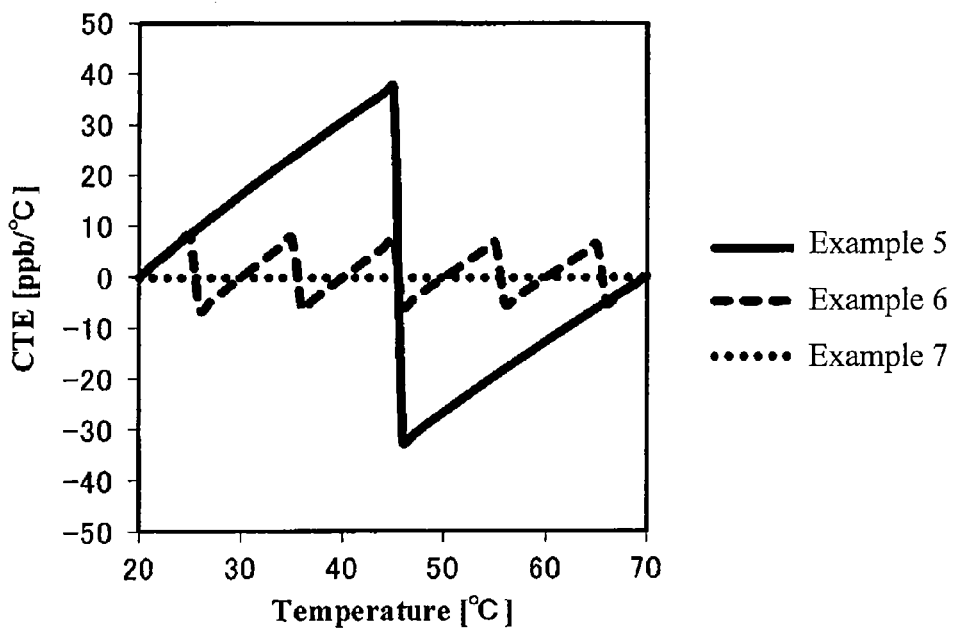
FIG. 4 is a graph showing CTE distributions in respect to the glasses of Examples 5 to 7 when temperature difference of 50° C. occurred between two opposite surfaces.

As is apparent from FIGS. 3 and 4, the TiO$_2$—SiO$_2$ glasses of Examples 5 to 7 in which COTs in the two opposite surfaces are consistent with the incidence surface temperature (70° C.) and the back surface temperature (20° C.), respectively, at the time of irradiation with EUV light achieve CTEs in each the whole TiO$_2$—SiO$_2$ glass being substantially zero, that is, CTE in each the whole TiO$_2$—SiO$_2$ glass satisfies 0±50 ppb/° C., at the time of irradiation with EUV light. Above all, in the TiO$_2$—SiO$_2$ glass of Example 6 in which COT varies in a stepwise fashion between the two opposite surfaces and the TiO$_2$—SiO$_2$ glass of Example 7 in which COT varies continuously between the two opposite surfaces, CTE distributions in the TiO$_2$—SiO$_2$ glass become smaller. In particular, in the TiO$_2$—SiO$_2$ glass of Example 7 in which COT varies continuously between the two opposite surfaces, CTE in the whole TiO$_2$—SiO$_2$ glass is 0 ppb/° C.

On the other hand, the TiO$_2$—SiO$_2$ glasses of Examples 3 and 4 in which each the whole TiO$_2$—SiO$_2$ glass has uniform COT generate a portion that does not satisfy CTE being substantially zero, that is, a portion that does not satisfy CTE being 0±50 ppb/° C., in the glass.

Figure 5:
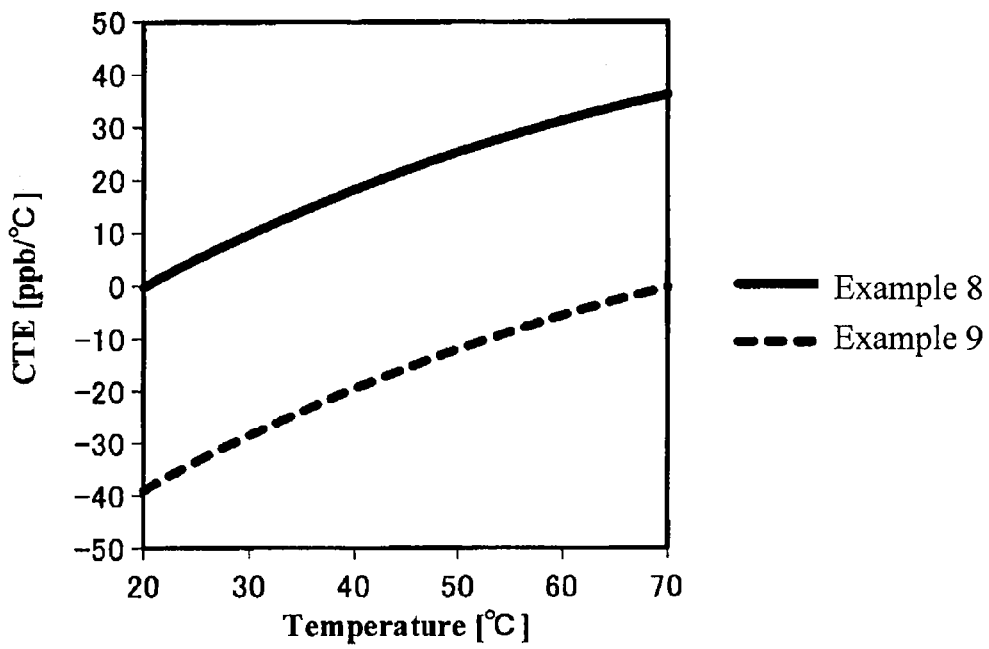
FIG. 5 is a graph showing CTE distributions in respect to the glasses of Examples 8 and 9 when temperature difference of 50° C. occurred between two opposite surfaces.
Figure 6:
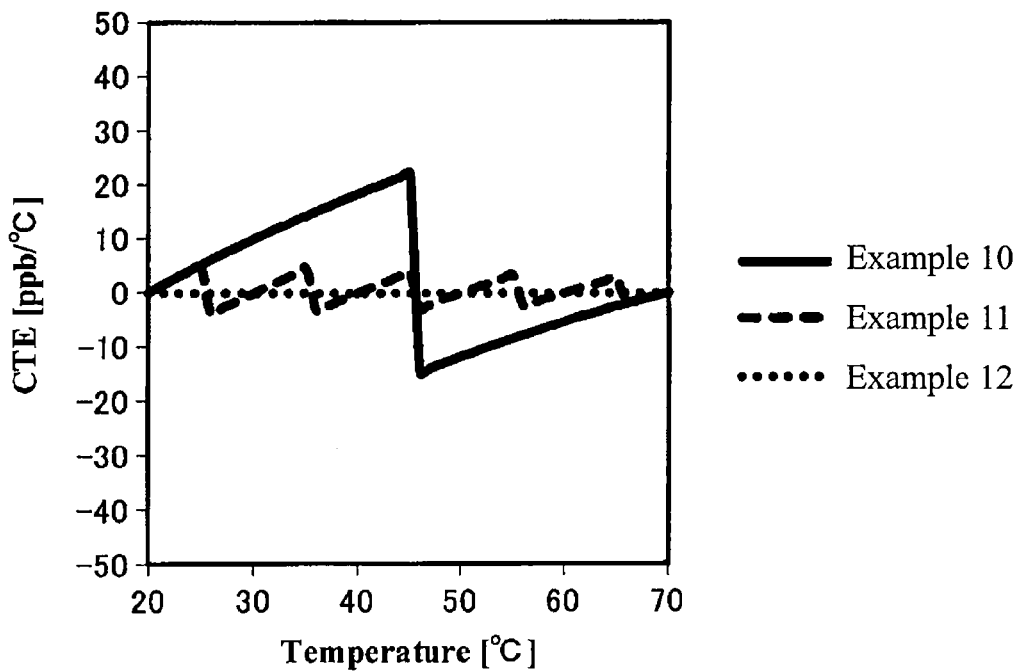
FIG. 6 is a graph showing CTE distributions in respect to the glasses of Examples 10 to 12 when temperature difference of 50° C. occurred between two opposite surfaces.

As is apparent from FIGS. 5 and 6, the TiO$_2$—SiO$_2$ glasses of Examples 10 to 12 in which COTs in the two opposite surfaces are consistent with the incidence surface temperature (70° C.) and the back surface temperature (20° C.), respectively, at the time of irradiation with EUV light achieve CTEs in each the whole TiO$_2$—SiO$_2$ glass being substantially zero, that is, CTE of each the whole TiO$_2$—SiO$_2$ glass satisfies 0±25 ppb/° C., at the time of irradiation with EUV light. Above all, in the TiO$_2$—SiO$_2$ glass of Example 11 in which COT varies in a stepwise fashion between the two opposite surfaces and the TiO$_2$—SiO$_2$ glass of Example 12 in which COT varies continuously between the two opposite surfaces, CTE distributions in the TiO$_2$—SiO$_2$ glass become smaller. In particular, in the TiO$_2$—SiO$_2$ glass of Example 12 in which COT varies continuously between the two opposite surfaces, CTE in the whole TiO$_2$—SiO$_2$ glass is 0 ppb/° C.

On the other hand, the TiO$_2$—SiO$_2$ glasses of Examples 8 and 9 in which each the whole TiO$_2$—SiO$_2$ glass has uniform COT generate a portion that does not satisfy CTE being substantially zero, that is, a portion that does not satisfy CTE being 0±25 ppb/° C., in the glass.

While the invention has been described in detail and with reference to specific embodiments thereof, it will be apparent to one skilled in the art that various changes and modifications can be made therein without departing from the sprit and scope thereof.

This application is based on Japanese patent application No. 2009-295221 filed on Dec. 25, 2009, the entire contents of which are incorporated hereinto by reference. All references cited herein are incorporated in their entirety.

DESCRIPTION OF REFERENCE NUMERALS AND SIGNS

10: Substrate for EUVL Optical Member
11: Surface (optical surface: incidence surface)
12: Surface (mounting surface: back surface)
100: Electrostatic chuck

The invention claimed is:

1. A substrate for EUV lithography optical member, comprising a silica glass containing TiO$_2$,
wherein the substrate has two opposite surfaces, and the substrate has Cross-Over temperatures (COTs) at which a coefficient of linear thermal expansion (CTE) is 0 ppb/° C., and
wherein the substrate has a difference in the COTs between the two opposite surfaces of 5° C. or more, and
wherein the substrate has the COTs which vary in a stepwise fashion along the thickness direction from one surface toward the other surface.

2. The substrate for EUV lithography optical member according to claim 1, wherein one surface of the two opposite surfaces of the substrate has a COT of 22° C.±3° C., and the other surface has a COT 5° C. or higher than the COT of the one surface.

3. A substrate for EUV lithography optical member, comprising a silica glass containing TiO$_2$,
wherein the substrate has two opposite surfaces, and the substrate has Cross-Over temperatures (COTs) at which a coefficient of linear thermal expansion (CTE) is 0 ppb/° C., and
wherein the substrate has a difference in the COTs between the two opposite surfaces of 5° C. or more, and
wherein the substrate has the COTs which vary continuously along the thickness direction from one surface toward the other surface.

4. The substrate for EUV lithography optical member according to claim 1, wherein the COTs are controlled by the TiO$_2$ concentration in the silica glass.

5. The substrate for EUV lithography optical member according to claim 1, wherein the COTs are controlled by a fictive temperature of the silica glass, and wherein the COTs are increased or decreased, when the fictive temperature is increased or decreased, respectively.

6. The substrate for EUV lithography optical member according to claim 1, wherein the TiO$_2$ concentration in the silica glass is from 3% to 10% by mass.

7. The substrate for EUV lithography optical member according to claim 1, wherein the silica glass has an F concentration of 1,000 ppm or more.

8. The substrate for EUV lithography optical member according to claim 1, wherein the silica glass has an OH concentration of 600 ppm or more.

9. The substrate for EUV lithography optical member according to claim 1, wherein the silica glass has a fictive temperature of lower than 1,150° C.

10. The substrate for EUV lithography optical member according to claim 1, wherein the substrate has the COTs which increase in a stepwise fashion along the thickness direction from one surface toward the other surface.

11. The substrate for EUV lithography optical member according to claim 1, wherein the substrate has the COTs which decrease in a stepwise fashion along the thickness direction from one surface toward the other surface.

12. The substrate for EUV lithography optical member according to claim 3, wherein the substrate has the COTs which increase continuously along the thickness direction from one surface toward the other surface.

13. The substrate for EUV lithography optical member according to claim 3, wherein the substrate has the COTs which decrease continuously along the thickness direction from one surface toward the other surface.

14. The substrate for EUV lithography optical member according to claim 3, wherein the COTs are controlled by the $TiO_2$ concentration in the silica glass.

15. The substrate for EUV lithography optical member according to claim 3, wherein the $TiO_2$ concentration in the silica glass is from 3% to 10% by mass.

16. The substrate for EUV lithography optical member according to claim 3, wherein the silica glass has an F concentration of 1,000 ppm or more.

17. The substrate for EUV lithography optical member according to claim 3, wherein the silica glass has an OH concentration of 600 ppm or more.

18. The substrate for EUV lithography optical member according to claim 3, wherein the silica glass has a fictive temperature of lower than 1,150° C.

* * * * *